United States Patent [19]
Chiu

[11] Patent Number: 5,808,870
[45] Date of Patent: Sep. 15, 1998

[54] PLASTIC PIN GRID ARRAY PACKAGE

[75] Inventor: Anthony M. Chiu, Richardson, Tex.

[73] Assignee: STMicroelectronics, Inc., Carrollton, Tex.

[21] Appl. No.: 720,686

[22] Filed: Oct. 2, 1996

[51] Int. Cl.$^6$ ..................................................... H05K 7/20
[52] U.S. Cl. .......................... 361/705; 361/704; 361/717; 361/718; 361/719; 361/708; 361/707; 257/706; 257/707; 257/709; 165/80.2
[58] Field of Search ..................................... 361/688, 704, 361/705, 707, 708, 709, 710, 711, 717, 718, 719, 761; 257/706, 709, 710, 713, 675; 174/16.3, 52.2, 52.3, 52.4, 52.6; 165/185, 80.3

[56] References Cited

U.S. PATENT DOCUMENTS

| | | | |
|---|---|---|---|
| 4,860,165 | 8/1989 | Cassinelli | 361/710 |
| 5,265,321 | 11/1993 | Nelson et al. | 361/718 |
| 5,414,928 | 5/1995 | Bonitz et al. | 361/783 |
| 5,450,283 | 9/1995 | Lin et al. | 361/704 |
| 5,542,601 | 8/1996 | Fallon et al. | 228/119 |
| 5,583,378 | 12/1996 | Marrs et al. | 257/710 |
| 5,599,747 | 2/1997 | Bhatt et al. | 437/209 |
| 5,625,228 | 4/1997 | Rogren | 257/712 |

Primary Examiner—Leo P. Picard
Assistant Examiner—Boris L. Chervinsky
Attorney, Agent, or Firm—Theodore E. Galanthay; Lisa K. Jorgenson; Renee Michelle Larson

[57] ABSTRACT

A plastic pin support of a plastic PGA package is used to hold conductor pins in alignment, for electrical contact, with a printed circuit board and a socket. The printed circuit board is mounted on the plastic pin support which is electrically connected to respective conductor pins of the plastic pin support. A first adhesive layer, containing silver fillers, connects a silicon chip housed in the plastic PGA package to a heat sink and conducts heat from the silicon chip to the heat sink. The first adhesive layer also absorbs thermal expansion variations between the silicon chip and the heat sink during thermal cycles. A second adhesive layer connects the printed circuit board to the heat sink. Separation between the silicon chip and the printed circuit board is provided by a gap between the silicon chip and the printed circuit board which is filled with a protection layer, such as epoxy, to maintain separation between the silicon chip, the printed circuit board, and to protect the active surface of the silicon chip. The heat sink made of formable metal such as anodized Aluminum is formed around the silicon chip, the printed circuit board, and the plastic pin support providing heat dissipation and protection to the plastic pin support, the printed circuit board and the silicon chip.

15 Claims, 4 Drawing Sheets

PLASTIC PIN GRID ARRAY PACKAGE

BACKGROUND OF THE INVENTION

1. Technical Field

The present invention relates generally to Integrated Circuit (IC) packages and more specifically to plastic pin grid array (PGA) IC packages.

2. Discussion of the Prior Art

A Pin Grid Array (PGA) package is a square or rectangular Integrated Circuit (IC) package with rigid pins coming out the bottom for inserting into sockets. Because a PGA package may be inserted into a socket, such as a Zero Insertion Force (ZIF) socket, where it will be retained without soldering, PGA packages are readily interchangeable. When it is desired to replace a PGA package, the existing PGA package may be readily and quickly removed by simply popping the existing PGA package out of its socket and inserting a new PGA package in its place. PGA packages have been used for approximately 20 to 25 years and are especially popular in the Personal Computer (PC) industry due to the interchangeability they provide. As microprocessor IC chips become faster and faster, the PGA package in which they are housed may be easily removed and replaced with a PGA package housing a faster microprocessor IC chip.

A ceramic PGA package is a hermetically sealed PGA package that has a ceramic substrate and Tungsten conductors. Because ceramic PGA packages are hermetically sealed they experience no corrosion due to moisture, are highly reliable and have a very long life which may be fifty years or more. Because ceramic PGA packages have been used in the art for several years, they have a very stable production. Ceramic PGA packages are very popular in the PC industry and in military applications because of their high reliability and long life. Ceramic PGA packages are suitable for housing devices having operating speeds of less than approximately 200 MHz.

While ceramic PGA packages offer advantages of reliability and long shelf-life, a well known problem is that ceramic PGA packages are expensive to manufacture because they are made of ceramic. Additionally, ceramic PGA packages use Tungsten conductors which are high resistance contacts that may introduce delays for high speed IC devices housed in the ceramic PGA package as a function of the IC device substrate size.

Because of the expense and performance problems associated with ceramic PGA packages, users of PGA packages, such as personal computer manufacturers, have been using as an alternative to a ceramic PGA package an Adaptor referred to as an Interposer in some low cost, low power computer applications. Referring to FIG. 1, a view of such an Adaptor 10, known in the art, is shown. An Adapter 10 allows an IC device in a Quad Flat Pack (QFP) package to be used in applications which require a Pin Grid Array (PGA) package. The QFP package which houses the IC is soldered onto a PGA package base. Adaptor 10 allows a QFP integrated circuit device 18 to be used in a through-hole circuit board. The adaptor pins 16 connect the I/O signal leads of the QFP 18 through a support base 14 directly to corresponding PGA package pins 12. This type of package, which costs less than the cost of using a ceramic PGA package, has limited thermal dissipation characteristics, but may be sufficient for personal computer applications requiring a low cost package solution and non-stringent thermal requirements.

As the price of IC chips, such as central processing unit (CPU) and microprocessor chips, continue to drop in cost and to increase in speed, there is an unmet need in the art to find an alternative to expensive ceramic PGA packaging that is much lower in cost and has enhanced speed and thermal characteristics. Major factors for an alternative to ceramic PGA packaging include: market acceptance by Original Equipment Manufacturers (OEM), lower cost than ceramic PGA packages, compatibility with existing ceramic PGA packages, manufacturability in existing assembly lines, reliability, and suitability for use with high speed IC devices characterized as having switching speeds in excess of approximately 150 MHz.

There is currently no PGA package that meets all of these factors. There is thus an unmet need in the art to find an alternative to ceramic PGA packaging that is much lower in cost, that has enhanced speed characteristics, that is compatible with other PGA packages currently available, that is readily manufacturable, that is sufficiently reliable, and that has enhanced thermal characteristics.

SUMMARY OF THE INVENTION

It is an object of the invention to provide a PGA package that is compatible with existing ceramic PGA packages.

It is another object of the invention to provide a PGA package that is capable of dissipating heat in high speed applications.

It is yet another object of the invention to reduce the high resistance caused by Tungsten conductors of existing ceramic PGA packaging which has the effect of reducing chip performance by introducing delays.

It is another object of the invention to reduce the weight of a PGA package.

It is yet another object of the invention to provide a PGA package that is less costly to produce than existing ceramic PGA packaging.

It is further another object of the invention to provide a PGA package suitable for use with high speed IC devices having switching speeds in excess of approximately 150 MHz.

In accordance with the present invention, a plastic pin grid array (PGA) package provides an alternative to ceramic PGA packaging and is much lower in cost, compatible with existing ceramic PGAs, can be manufactured in existing assembly lines, is suitable for higher than 150 MHz switching speeds of IC devices such as CPUs, and is capable of dissipating heat in high speed applications. A plastic pin support is used to hold conductor pins in alignment, for electrical contact, with a printed circuit board and a socket. The printed circuit board is mounted on the plastic pin support which is electrically connected to respective conductor pins of the plastic pin support. A first adhesive layer, such as epoxy containing silver fillers, connects a silicon chip housed in the plastic PGA package to a heat sink and conducts heat from the silicon chip to the heat sink. The first adhesive layer also absorbs thermal expansion variations between the silicon chip and the heat sink during thermal cycles. A second adhesive layer connects the printed circuit board to the heat sink. Separation between the silicon chip and the printed circuit board is provided by a gap therebetween which is filled with a protection layer, such as epoxy, to provide protection and maintain separation between the silicon chip and the printed circuit board. The heat sink made of formable metal, such as anodized Aluminum, is formed around the silicon chip, the printed circuit board, and the plastic pin support providing heat dissipation and protection to the plastic pin support, the printed circuit board and the silicon chip.

BRIEF DESCRIPTION OF THE DRAWINGS

The novel features believed characteristic of the invention are set forth in the claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
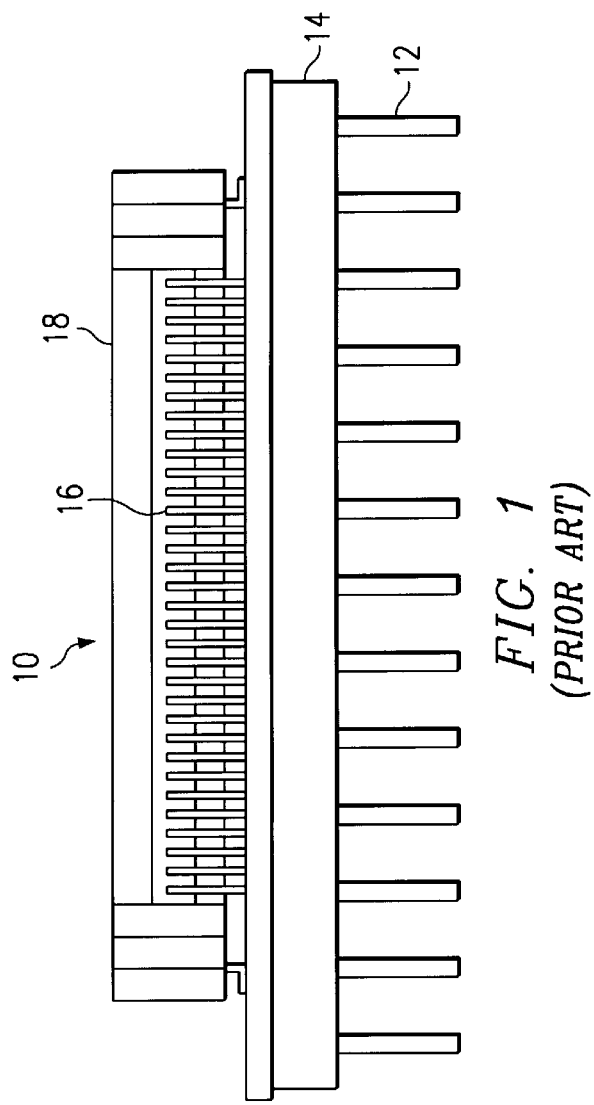
FIG. 1 is a side view of an adaptor, which converts a Quad Flat Pack (QFP) package into a Pin Grid Array (PGA) package, known in the art.
Figure 2A:
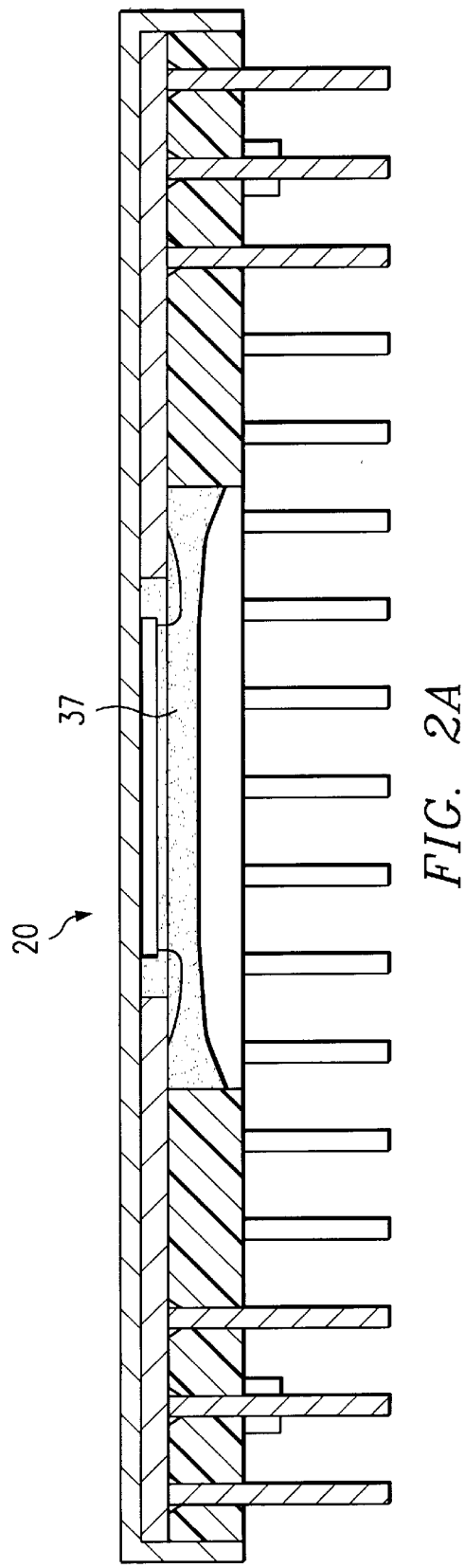
FIG. 2a is a cross-sectional view of a plastic pin grid array package showing an epoxy filled cavity, according to the present invention.
Figure 2:
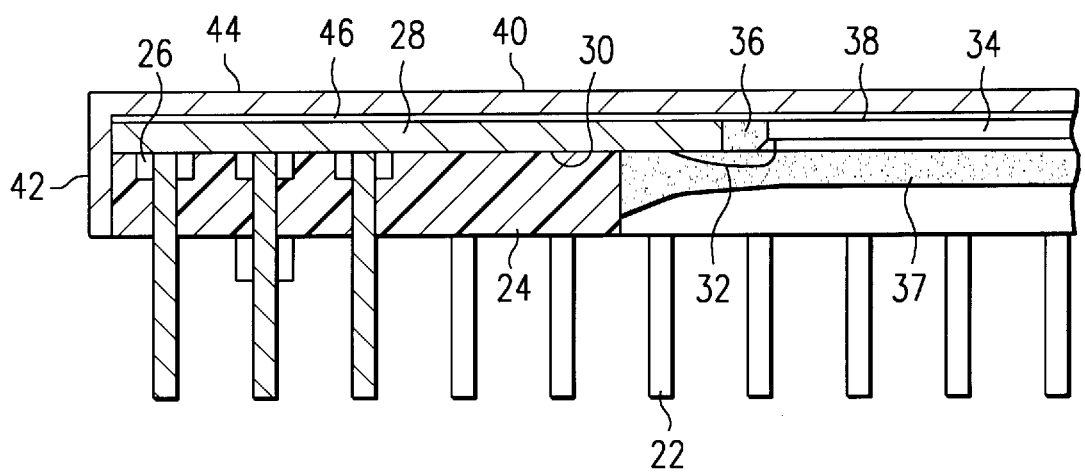
FIG. 2 is an expanded cross-sectional view of a plastic pin grid array package, according to the present invention.
Figure 2C:
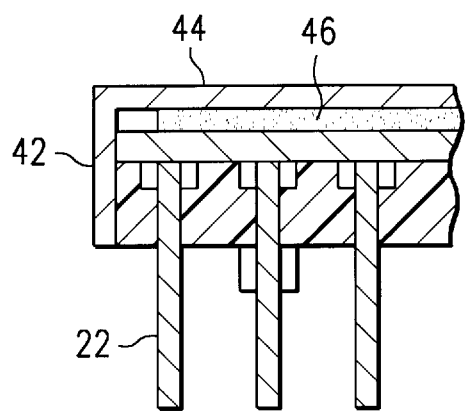
FIG. 2c illustrates the attachment of a printed circuit board to the heat sink, according to the present invention.
Figure 3:
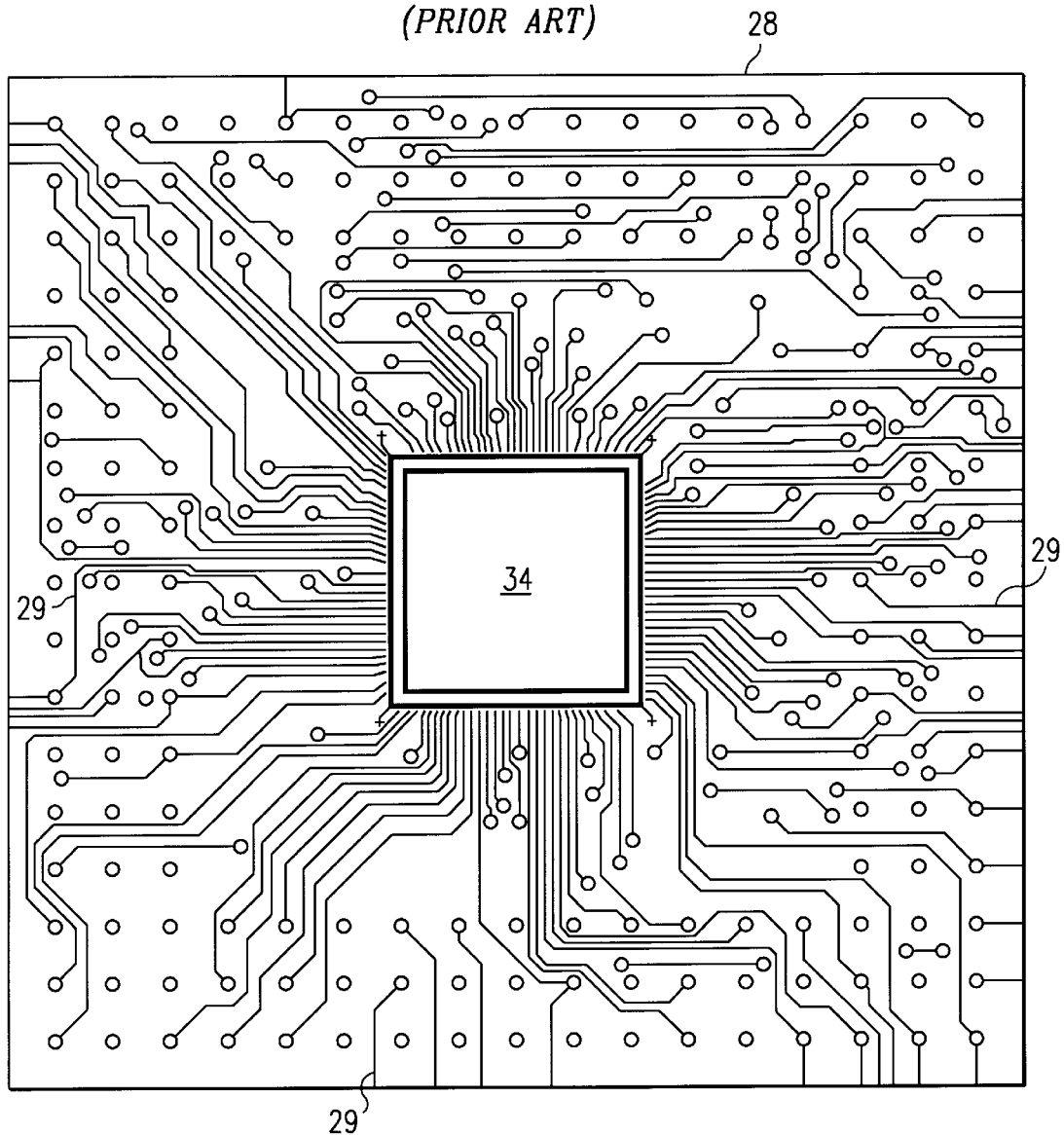
FIG. 3 is an illustration of electrical traces of the type commonly found on printed circuit boards and known in the art.

Referring to FIG. 2, a view of a plastic Pin Grid Array (PGA) package, according to the present invention, is shown. The plastic PGA package 20 is comprised of conductor pins 22, a plastic pin support 24, a printed circuit board (PCB) 28 containing electrical traces, a connecting wire 32, a silicon chip 34, and a heat sink 40. Each conductor pin 22 is soldered to the PCB 28 with a solder joint 26 through the plastic pin support 24. The conductor pins may be gold plated or any other conductive material. The plastic pin support 24 is used to hold each conductor pin 22 in alignment, for electrical contact, with a respective electrical trace of the PCB 28 and a socket such as a Zero Insertion Force (ZIF) socket into which the plastic PGA package 20 may be placed. The respective electrical traces 29 on PCB 28 to which each conductor pin 22 is connected are well known in the art and are shown in FIG. 3. As is known in the art, the exact arrangement of electrical traces 29 is determined by the board layout and other considerations. FIG. 3 further illustrates silicon chip 34 in printed circuit board 28.

Figure 2B:
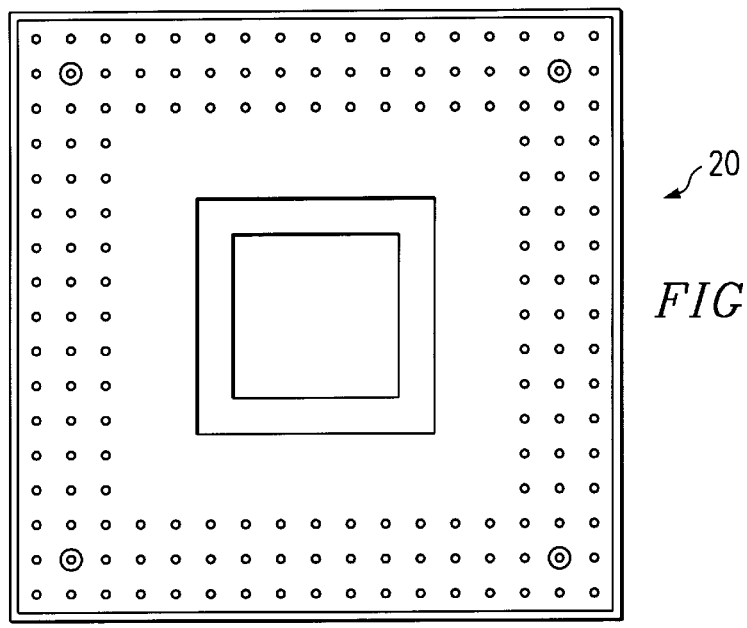
FIG. 2b is a plane view of a plastic pin grid array package, according to the present invention.

The silicon chip 34 is attached to the heat sink 40 with an adhesive layer 38 which alleviates mechanical stress caused by silicon chip 34 and heat sink 40 having different thermal expansion rates. Additionally, adhesive layer 38 provides mechanical protection for the connecting wire 32 on silicon chip 34. Adhesive layer 38 may be an epoxy layer, such as Ablestik 8355F epoxy with silver fillers. Silicon chip 34 is separated from the PCB 28 by a gap 36. Gap 36 is filled with protection layer 37 to provide protection and maintain separation between the silicon chip 34 and the PCB 28. Protection layer 37 may be a protective material, such as Hysol 4450 epoxy. A cross-sectional view of a plastic pin grid array package that shows the protection layer 37 between silicon chip 34 and the PCB 28 is illustrated in FIG. 2a. A connecting wire 32 connects the PCB 28 to the silicon chip 34. The PCB 28 may be a multi-layer fiberglass laminate including a four layer fiberglass laminate made of FR4 (Fire Retardant Class 4) fiberglass, BT Resin, DriClad, or other types of fiberglass, epoxy systems well known in the art. The heat sink 40 has a top portion 44 and side portions 42 that are formed around the plastic pin support 24, the PCB 28, and the silicon chip 34 as shown. The active surface of silicon chip 34 is in contact with protection layer 37 a plane view of the plastic pin grid array package of the present invention is shown in FIG. 2b.

In addition to alleviating mechanical stress adhesive layer 38 has thermally conductive properties which facilitate heat dissipation from the silicon chip 34 to the heat sink 40. Adhesive layer 38 may also have electrically conductive properties, provided by silver fillers contained within adhesive layer 38, to increase thermal conductivity and to provide an electrical ground from the silicon chip 34 to the heat sink 40.

The thickness of heat sink 40 will vary with the surface area of the IC silicon chip 34. The larger the silicon chip 34, the thicker heat sink 40 will be. For example, a silicon chip having 168 conductor pins will have a heat sink thickness of 0.025 inch mil while a configuration with 296 conductor pins will have a heat sink thickness of 0.040 inch mil. The heat sink 40 may be made of any malleable metal, including copper and aluminum, that may conform over the top and around the sides of the package.

PCB 28 is attached to heat sink 40 by applying an adhesive layer 46, such as Epotek H72 epoxy, between the PCB 28 and heat sink 40 as shown in the blow-up detail of FIG. 2. In addition to epoxy, adhesive layer 46 may be made of other thermosetting adhesives including, but not limited to, the following: phenol formaldehyde (phenolic), resorcinol, phenol-resorcinol, urea formaldehyde, melamine, melamine-urea formaldehyde, and alkyd. During the manufacturing process, heat is then applied until adhesive layer 46 hardens and is "cured", forming a stable attachment between the PCB 28 and the heat sink 40.

The temperature of plastic PGA package 20 for a high speed silicon chip 34 has a thermal cycle that ranges from a non-operating room temperature of approximately 22 degrees Celsius to an operating temperature of approximately 100 degrees Celsius. Silicon chip 34 has a typical thermal expansion rate of approximately 4 parts per million per degree centigrade (ppm/°C.) while heat sink 40 has a much higher thermal expansion rate. For example, a copper heat sink has a thermal expansion rate of 15 (ppm/°C.) and an aluminum heat sink has a thermal expansion rate of 22 (ppm/°C.). Thus silicon chip 34 will experience much less expansion over a given temperature change than will heat sink 40. This difference in thermal expansion rate between the silicon chip 34 and the heat sink 40 would introduce mechanical stress if silicon chip 34 and heat sink 40 were directly connected without benefit of a buffer. Adhesive layer 38 has silver fillers for conductivity and is used as a buffer between heat sink 40 and silicon chip 34 to alleviate this mechanical stress. Additionally, silver fillers may be used in adhesive layer 38 to improve the conductivity between silicon chip 34 and heat sink 40.

Figure 4A:
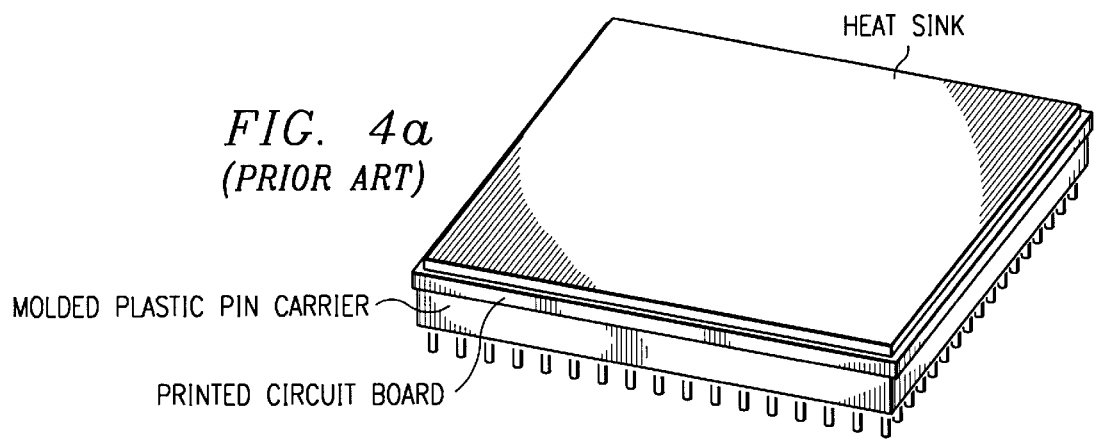
FIG. 4a is a view of a flat heat sink known in the art.
Figure 4B:
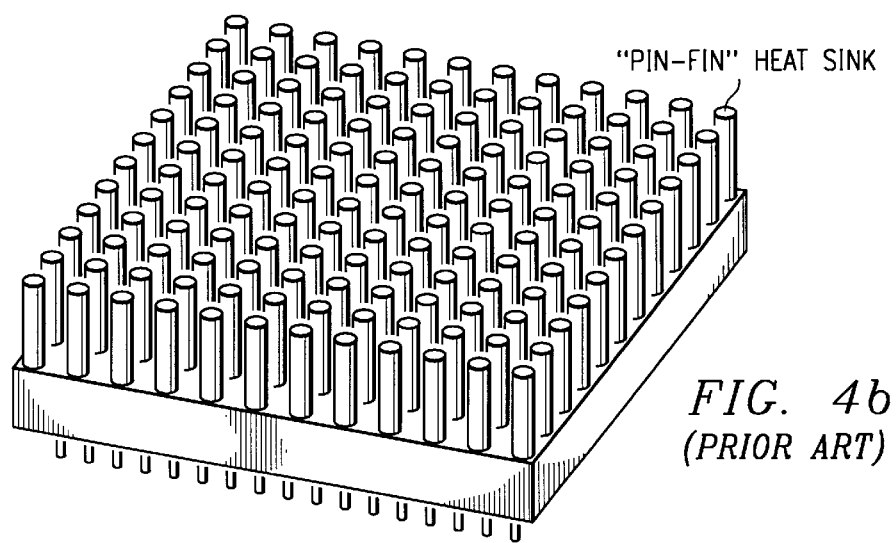
FIG. 4b is a view of a "Pin-Fin" heat sink known in the art.

The present invention offers several advantages over the prior art. First, formed heat sink 40, made of a malleable metal such as anodized Aluminum, provides rigidity and mechanical reliability to the plastic PGA package. Second, formed heat sink 40 provides maximum strength for minimum weight and maintains the flatness of the plastic PGA package. Third, heat sink 40 protects plastic pin support 24, PCB 28, and silicon chip 34 from mechanical damage and moisture infusion. Conversely, a flat heat sink, known in the art and shown in FIG. 4a, provides relatively little protection from mechanical damage and moisture infusion of the silicon chip which it houses. A "Pin-Fin" heat sink, also known in the art and shown in FIG. 4b, provides protection from mechanical damage and moisture infusion, but is disadvantaged by its size and weight. Fourth, formed heat sink 40 makes the plastic PGA package cosmetically and dimensionally compatible with a conventional ceramic PGA package known in the art. Fifth, formed heat sink 40 makes the plastic PGA package easier to manufacture by using the side portions 42 of heat sink 40 as rough guides during stacking of the PCB 28 and plastic pin support 24. Finally, formed heat sink 40 helps to contain adhesive layer 46 before it is cured and hardens.

Another advantage of the present invention is that plastic has a lower material cost, approximately 50% lower, than does ceramic. Additionally, the plastic PGA package is lighter and has a shorter tooling time than the ceramic PGA package while maintaining pin compatibility with ceramic PGA packages. While the plastic PGA package is not hermetically sealed, the operating temperature inside the plastic PGA package for a high speed silicon chip may exceed 100 degrees Celsius thereby evaporating moisture and greatly reducing the probability of corrosion due to moisture infusion.

Yet a further advantage of the present invention is that the plastic PGA package has a higher electrical performance than a ceramic PGA package for high speed applications. The plastic PGA package uses copper rather than Tungsten conductors which produces less resistance and thus shorter time delays for high speed silicon chips. A plastic PGA package is capable of supporting high speed silicon chips having switching in excess of approximately 150 MHz, which is the limit for a ceramic PGA package. Thus a silicon chip having a switching speed of approximately 300 MHz, for instance, would experience minimum delays if housed in the plastic PGA of the present invention.

A plastic PGA package provides an alternative to ceramic PGA packaging that is much lower in cost, reduces weight, is pin compatible with existing ceramic PGA packages, is manufacturable in existing assembly lines, is reliable, is suitable for higher than 150 MHz switching, and dissipates heat in high speed applications.

While the invention has been particularly shown and described with reference to a preferred embodiment, it will be understood by those skilled in the art that various changes in form and detail may be made therein without departing from the spirit and scope of the invention.

What is claimed is:

1. A plastic pin grid array (PGA) package, comprising:
    a plastic pin support having a side portion, a plurality of conductor pins extending from one face to the opposite face thereof, and an end portion;
    a printed circuit board mounted on the plastic pin support having a top portion, a first end portion, a second end portion and a plurality of electrical traces, wherein each conductor pin of the plurality of conductor pins is electrically connected to a respective electrical trace of the plurality of electrical traces;
    a silicon chip having a first thermal expansion rate;
    a heat sink having a top portion, a side portion, and a second thermal expansion rate;
    a first adhesive layer connecting the non-active surface of the silicon chip to a underside of the top portion of the heat sink, for conducting heat from the silicon chip to the heat sink and for absorbing thermal expansion variations between the first thermal expansion rate of the silicon chip and the second thermal expansion rate of the heat sink over changes in temperature during a thermal cycle;
    a second adhesive layer connecting the top portion of the printed circuit board to the underside of the top portion of the heat sink, the heat sink being formed over the plastic pin support, the entire printed circuit board, and the silicon chip;
    a protection layer, for maintaining separation between the silicon chip and the first end portion of the printed circuit board and protection over an active surface of the silicon chip; and
    a means for electrically connecting the silicon chip to the printed circuit board.

2. The package of claim 1, wherein the printed circuit board includes a plurality of layers of fiberglass laminate.

3. The package of claim 2, wherein the printed circuit board includes a plurality of at least four layers of fiberglass laminate.

4. The package of claim 1, wherein the first adhesive layer is an epoxy layer.

5. The package of claim 1, wherein the second adhesive layer is an epoxy layer.

6. The package of claim 1, wherein the protection layer is an epoxy layer.

7. The package of claim 1, wherein the conductor pins are gold plated.

8. The package of claim 1, wherein the conductor pins are solder plated.

9. The package of claim 1, wherein the means for electrically connecting the silicon chip to the printed circuit board is a connecting wire.

10. The package of claim 1, wherein the first adhesive layer is silver filled.

11. The package of claim 1, wherein the heat sink comprises copper.

12. The package of claim 1, wherein the heat sink comprises anodized Aluminum.

13. The package of claim 1, wherein the silicon chip is an integrated circuit device.

14. The package of claim 1, wherein the plurality of electrical traces of the printed circuit board are copper.

15. The package of claim 1, wherein the top portion of the heat sink is formed over a non-active surface of the silicon chip and the top portion of the printed circuit board and the side portion of the heat sink is formed around the second end portion of the printed circuit board and the end portion of the plastic pin support.

* * * * *